United States Patent [19]

Knüttel et al.

[11] Patent Number: 5,646,532
[45] Date of Patent: Jul. 8, 1997

[54] PARTIAL BODY TOMOGRAPH

[75] Inventors: Bertold Knüttel, Rheinstetten; Michael Westphal, Offenbach, both of Germany

[73] Assignee: Bruker Medizintechnik GmbH, Rheinstetten, Germany

[21] Appl. No.: 308,143

[22] Filed: Sep. 19, 1994

[30] Foreign Application Priority Data

Sep. 20, 1993 [DE] Germany .................. 43 31 843.6
Jan. 25, 1994 [DE] Germany .................. 44 02 027.9

[51] Int. Cl.$^6$ ........................ G01R 33/30; A61B 5/055
[52] U.S. Cl. ........................ 324/321; 128/653.5
[58] Field of Search ........................ 324/300, 307, 324/309, 316, 318, 321; 128/653.2, 653.5

[56] References Cited

U.S. PATENT DOCUMENTS

| | | | |
|---|---|---|---|
| 5,008,624 | 4/1991 | Yoshida | 324/318 |
| 5,117,188 | 5/1992 | Ohkawa . | |
| 5,159,929 | 11/1992 | Morris et al. | 128/653.2 |
| 5,277,183 | 1/1994 | Vij | 128/653.5 |
| 5,304,934 | 4/1994 | Evangelos et al. . | |
| 5,361,054 | 11/1994 | Knuttel | 324/318 X |
| 5,445,152 | 8/1995 | Bell et al. | 128/653.5 |

FOREIGN PATENT DOCUMENTS

| | | | |
|---|---|---|---|
| 0350267 | 1/1990 | European Pat. Off. | H01F 7/22 |
| 3639140 | 5/1987 | Germany | G01N 24/00 |
| 4010032 | 10/1991 | Germany | G01R 33/38 |
| 61-172040 | 8/1986 | Japan | G01R 33/38 |
| 2259773 | 3/1993 | United Kingdom | G01R 33/38 |

OTHER PUBLICATIONS

Patent Abstracts of Japan, vol. 10, No. 382 (P-529) (2439) 20, Dec. 20, 1986, abridged.

"BIOSPEC-Series MR-Tomography and In-Vivo Spectroscopy at High Fields" Brochure of Bruker Medizintechnik GmbH dated Mar. 1992.

Primary Examiner—Sandra L. O'Shea
Assistant Examiner—Roger C. Phillips

[57] ABSTRACT

An NMR tomography magnet system (1) comprises a cryostat having a horizontal room temperature bore (2) with a diameter d between 20 cm and 40 cm having a vessel (3) filled with liquid helium. In intimate thermal contact with the liquid helium is a superconducting solenoid coil (4) with a horizontal axis (100; z=0) for the production of a static homogeneous magnetic field B in a homogeneity volume (5) within the room temperature bore (2). The center of the homogeneity volume is located at a separation $l_m$ from an axial end (z=0) of the room temperature bore (2) and the outer skin (6) of the cryostat exhibits, at the depth $l_m$ from an axial end of the room temperature bore (2) and at least in an angular region about the horizontal cryostat axis (100), minimum separations $h_e$, h from the inside of the room temperature bore (2) whereby $l_m$, $h_e$<35 cm, preferentially<30 cm, and h<50 cm. In this fashion, an investigational apparatus for partial body applications, in particular, for the investigation of human extremities is made available which can be manufactured with compact construction in an economical fashion. The apparatus facilitates high imaging resolution with low stray fields and, in particular, allows for investigations of patients with the patients assuming a comfortable body position.

16 Claims, 10 Drawing Sheets

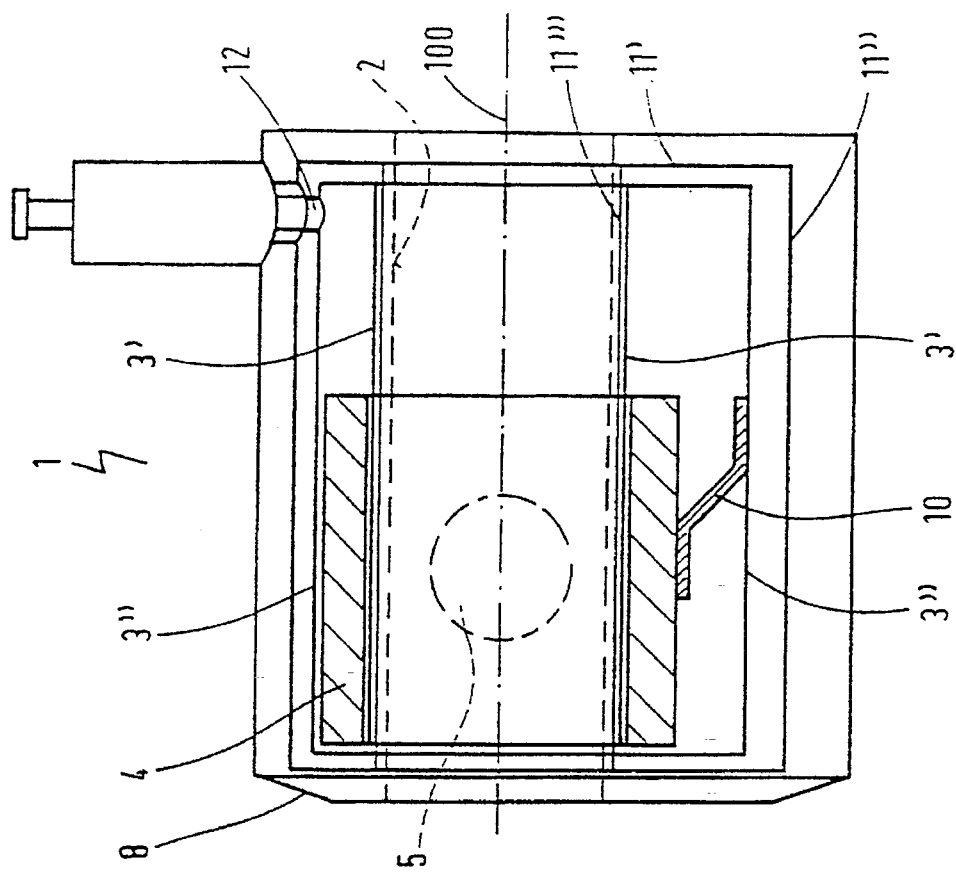
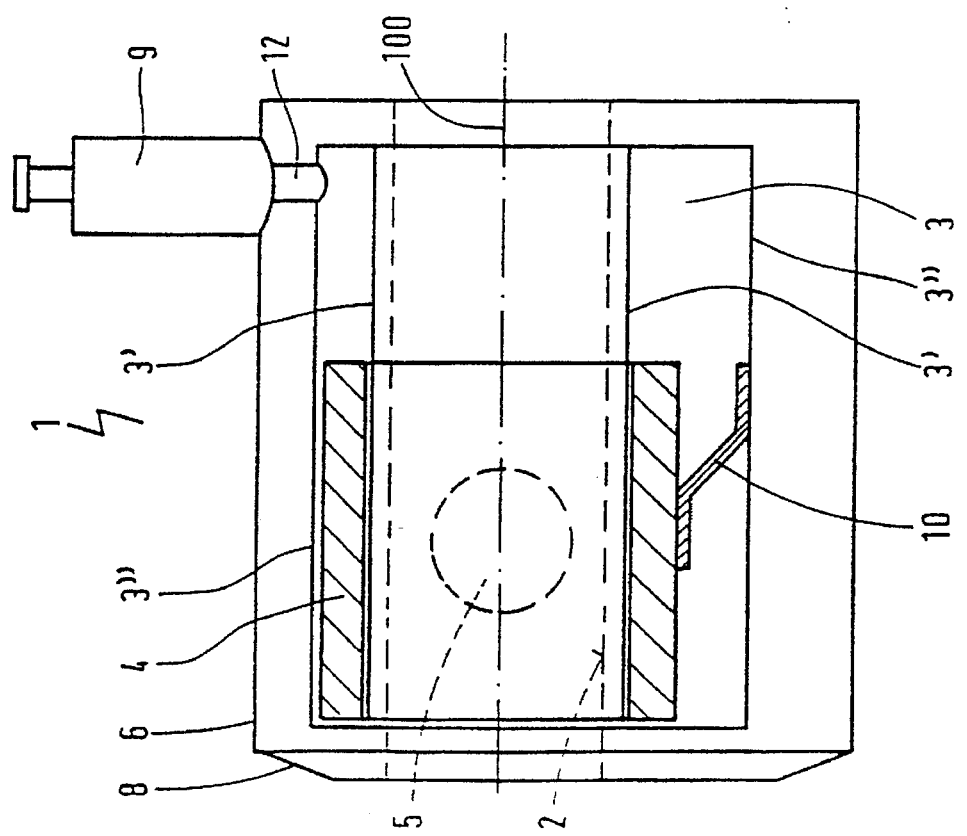
Fig. 3
Fig. 2

1

PARTIAL BODY TOMOGRAPH

BACKGROUND OF THE INVENTION

The invention concerns a nuclear magnetic resonance (NMR) tomography system with a cryostat having a horizontal room temperature bore with a diameter d between 20 cm and 50 cm, preferentially between 20 cm and 40 cm. The system has a vessel filled with liquid helium and a superconducting solenoid coil, in intimate thermal contact with the liquid helium and with a horizontal axis (r=0), for the production, within the room temperature bore, of a static homogeneous magnetic field in a homogeneity volume. The homogeneity volume has a center located at a separation $l_m$ from an axial end (z=0) of the room temperature bore.

An NMR tomography system of this kind is, for example, known from the company brochure BIOSPEC-Series of the company Bruker Medizintechnik GmbH, D-76287 Rheinstetten, of March 1992.

The NMR tomography magnet systems which are known in the art serve, among other things, for in-vivo spectroscopy and image slice production in human medicine as well as for the investigation of small animals for purposes of research. Whereas the apparatuses with large magnet bore diameters in the range of 80–100 cm are utilized for full body investigations of patients, systems with magnetic bore diameters between 20 and 60 cm are normally primarily used for research purposes.

The apparatuses known in the art are poorly suited for partial body investigations of human extremities, for example, of a hand or a foot or even for the imaging of a human knee, since, with full body tomographs, the entire patient must be inserted and thereby, in general, signals from non-interesting regions of the body are simultaneously recorded during partial body investigations. Although an individual arm can be investigated approximately up to the elbow with smaller magnets in special cases, it is, however, not possible to undertake a partial body investigation of the human leg, in particular, in the knee region with apparatuses which are known in the art due to their geometry, since even a healthy patient would not be able to introduce the other leg which is to be investigated at right angles and horizontally extended into the narrow magnet bore. This is certainly not possible with sick or injured patients.

A superconducting magnet system for partial body tomography is known from DE-40 10 032 A1 with which an uninhibited access to the measuring volume of the system is easily possible from above due to the C-shaped cross section geometry of the corresponding cryostat to, in fact, substantially simplifies NMR investigation of the patient. This is, however, attained in the system known in the art at the expense of a very complicated cryostat construction which is costly to produce whereby, in addition, the forces with which the magnet coils pull each other which, for this type of magnet, are on the order of magnitude of several tons must be contained unsymmetrically which, due to the required safety standards, adds additional expense to the static construction of the system. In addition, a solenoid coil is not utilized in the C-shaped magnets known in the art rather a system of partially opposing coils so that, for equal volumes, a substantially lower maximum field strength can be produced than with a solenoid coil system.

A superconducting NMR magnet having a "temple-shaped" construction is known in the art from EP 0 350 267 A1 which allows for a comfortable sidewards access to the patient to be examined but which, however, requires a very complicated cryostat construction compared to conventional hollow cylindrical constructions. Due to the special coil shape of the temple-shaped magnet known in the art there is, on the other hand and in contrast to a solenoid magnet, an extremely poor utilization of field strength and therefore a substantially lower resulting NMR image resolution. Fine structures, which are particularly important for an orthopedist, can therefore not be sufficiently accurately seen.

Known in the art from U.S. Pat. No. 5,117,118 is, finally, a quasi open magnet configuration for NMR imaging, the so-called inside-out-magnet, with which the magnet coil exhibits a very large diameter and an extremely small depth and the investigational volume lies just outside of the magnet coil. However, a magnet system of this type has, in contrast to solenoid coils, the disadvantage of a strong outer region irradiated stray field, a substantially lower field homogeneity, a substantially smaller homogeneity region and a substantially lower maximum produceable field strength so that the resolution of the NMR images is much lower than with the above mentioned conventional magnet systems having solenoid coils such as those known in the art by the cited BIOSPEC-product line of the company Bruker Medizintechnik GmbH. For a given length of superconducting wire material, which contributes essentially to the price of such a magnet system, an inside-out-magnet coil is much less economical.

It is therefore the purpose of the present invention to create an NMR tomography magnet system for partial body investigations of human extremities which is easy and compact in construction as well as economical to produce and which allows for high resolution while thereby producing a relatively low stray field and with which the patient can be investigated in a comfortable body position.

SUMMARY OF THE INVENTION

This purpose is achieved in accordance with the invention in a manner which is as simple as it is effective in that, the outer skin of the cryostat, at least in an, angular region about the horizontal axis and between the axial end (z=0) of the room temperature bore and the depth $z=l_m$ of the center of the homogeneity volume, has a minimum separation from the axis (r=0) which for $0 \leq z \leq l_m$ is, at all locations, less than or equal to that of a line connecting the two points $P_1$ (z=0, r=$h_e$) and $P_2$ (z=$l_m$, r=h) and whereby:

$l_m$, $h_e$<35 cm, preferentially<30 cm, and h<50 cm.

This geometric configuration of the cryostat allows for a patient positioned on a horizontal bed whose, for example, leg is to be investigated in the vicinity of the knee, to insert this leg into the room temperature bore of the magnet system whereas the leg which is not to be investigated is seated in a comfortable fashion, without having to perform splits or other contortions, on the outer side of the magnet configuration in the angular region having the minimum separation between the outer skin of the cryostat and the inside of the room temperature bore. The solenoid construction of the magnet coil as well the largely cylinder shaped construction of the accompanying cryostat are also part of the configuration in accordance with the invention so that the configuration, in contrast to the above mentioned special configurations, can be produced with substantially lower technical and economic expense. In this fashion a "dedicated" NMR system which is compact, economical and particularly well-adapted to partial body investigations is made available which, in contrast to the full body tomography configurations, offers a substantially improved "fill factor" for partial body investigations and is thereby particularly economical. Because of the particularly high field strength of a solenoid magnet in relation to the volume, excellent NMR image resolution can be achieved, whereby fine structures, in particular for the application area of orthopedics, are imaged with sufficient accuracy.

In a preferred embodiment of the NMR tomography magnet system in accordance with the invention the angular region about the horizontal cryostat axis having the minimum separation $h_e$, h of the outer skin of the cryostat from the inside of the room temperature bore is arranged vertically above or sidewardly next to the room temperature bore. This configuration has the advantage of a high degree of comfort in the positioning of the patient to be examined, in particular for the partial investigation of a leg. The patient can, namely, lie on his back and the leg which is not being investigated can be positioned upwardly or spread sidewards at a relatively small angle.

In particular for this type of leg investigation, for example, in the area of orthopedics, in a further advantageous embodiment of the invention, a support for the patient's leg which is not to be investigated is provided for in proximity to the outer skin of the cryostat at the angular region about the horizontal cryostat axis having the minimum separations $h_e$, h of the outer skin of the cryostat from the inside of the room temperature bore.

Likewise preferred is an embodiment with which the end of the cryostat is slanted, at least in the angular region about the horizontal cryostat axis having the minimum separations $h_e$, h of the outer skin of the cryostat from the inside of the room temperature bore. Also through this measure in the event of leg investigations, a comfortable seating of that patient's leg which is not being investigated is achieved or improved.

Particularly preferred is an embodiment of the NMR tomography system in accordance with the invention in which the superconducting solenoid coils exhibit a winding distribution which is axially asymmetric so that the homogeneity volume of the magnetic field which can be produced by the solenoid coil has a separation $l_m$ from an axial end of the room temperature bore, whereas the axial length of the solenoid coil is larger than $2\,l_m$. In this fashion the homogeneity volume, and thereby the measuring volume, is further displaced in a forward direction towards the axial end of the room temperature bore into which the extremity of the patient is inserted. The separation $l_m$ can then be made even smaller for constant maximum produced field strength, diameter d of the room temperature bore, and minimal separation h between the outer skin of the cryostat and the inside of the room temperature bore. This has, precisely for NMR tomography system applications to partial body investigations, the advantage that the measuring volume is better accessed from the cryostat end and the body part to be investigated must not first be introduced through a long narrow tube. In addition, the entire construction is, in this fashion, kept more compact.

In an particularly preferred embodiment of the NMR tomography magnet system in accordance with the invention the vessel filled with liquid helium is arranged asymmetrically relative to the axis of the superconducting solenoid coil.

In a further preferred embodiment the vessel filled with liquid helium can, as a separate sole or as an additional measure, be arranged asymmetrically relative to the plane perpendicular to the axis of the superconducting solenoid coil at a separation $l_m$ from an axial end of the room temperature bore.

Particularly preferred is an embodiment with which the cryostat has a reduced outer diameter in the vicinity of an axial end having a patient access to the room temperature bore compared to the region of the opposite axial end. A substantial advantage of the asymmetric configuration of the helium tank is already known in the art from DE 37 24 562 A1 in that the minimal separation h of the outer skin of the cryostat from the inside of the room temperature bore can be reduced further by fashioning the configuration in such a manner that nearly no helium tank volume surrounds the magnetic coil.

In a particularly advantageous embodiment the superconducting solenoid coil is largely surrounded by good heat conducting material which, for its part, exhibits a good heat conducting connection to the deepest regions of the vessel filled with liquid helium. In this fashion absolutely no additional helium tank volume is required about the coil. The minimum separation h of the outer skin of the cryostat from the inside of the room temperature bore therefore reaches a theoretical minimum. Furthermore, the superconducting magnet coil is sufficiently well cooled even with low liquid helium levels in the vessel.

An embodiment of the NMR tomography system in accordance with the invention is particularly preferred with which a system of gradient coils is provided for the production of at least one approximately constant magnetic field gradient within the homogeneity volume of the static magnetic field produced by the superconducting solenoid coil. Hereby, a subsystem of transverse gradient coils is constructed unsymmetrically with respect to a plane E dividing the homogeneity volume perpendicular to the axis of the solenoid coil, but largely mirror symmetrically with respect to a plane containing this axis likewise dividing the homogeneity volume. The subsystem comprising only two partial coils whose windings each have the same winding direction, relative to the axis given by the direction of the gradient. A subsystem of axial gradient coils is additionally or alternatively arranged to be cylindrically symmetric with respect to the axis of the solenoid coil and completely unsymmetric relative to the plane E which divides the homogeneity volume and which is perpendicular to the axis of the solenoid coil. The axial gradient coil comprises at least two partial coils which are arranged at different sides of the plane E. The partial coils on the one side exhibit essentially the opposite winding direction than the partial coils on the other side of the plane E and the number of windings with a particular winding direction is not equal to the number of windings with an opposite winding direction.

This type of asymmetric "head gradient coils" are known in the art per se from DE 41 42 263 A1. The asymmetric head gradient coils contribute to an optimum spatial utilization of the entire configuration and facilitate larger clearance of the room temperature bore on the patient end side of the cryostat with a relatively small wall thickness. This geometrical configuration is extremely advantageous, in particular when examining a patient having a conically shaped leg with a large thigh diameter.

Also particularly preferred is an embodiment of the inventive NMR tomography magnet system having a system of tesseral gradient coils provided for the production of at least one, at least largely constant magnetic field gradient within the homogeneity volume of the static magnetic field produced by the superconducting solenoid coil, the system comprising at least four largely equal saddle type partial coils which are arranged symmetrically with radial and axial separations from an assumed coordinate origin at the center of the homogeneity volume each of which exhibits two electrically conducting segments running in the azimuthal direction about a z-axis which coincides with the axis of a solenoid coil one segment of which exhibiting as small a radial separation $r_1$ and the other segment as large a radial separation $r_2$ as possible from the z-axis, each partial coil exhibiting a plurality of windings, and both azimuthal segments exhibiting an axial separation from each other in the z-axis direction, whereby the radially outer segment radial separation $r_2$ from the z-axis is arranged, relative to the z-axis, axially closer to the coordinate origin than the radial inner segment with the radial separation $r_1$ from the z-axis and whereby both segments are connected to each other by conducting sections and are located on a common rotationally symmetric or ellipsoidal surface r(z).

This type of tesseral gradient coils is described in the older German patent application by the same assignee having the application number P 42 30 145.9-33, the contents of which are hereby incorporated by reference. A tesseral gradient coil system of this type allows for a further improved utilization of space and a better accessibility in particular for patients with large thighs, for example, athletes with leg injuries who are being investigated with the partial body tomography system for orthopedic reasons.

It has been proven advantageous in both above mentioned gradient coil configurations to actively shield the gradient coils with a system of shielding coils having the same symmetry as the gradient coils to be shielded. In this fashion the stray fields of the gradients can be further minimized in an extremely compact shielding configuration.

Further features and advantages of the invention can be extracted from the following description of the embodiments of the invention with reference to the drawings, which show the inventive details and from the claims. The features can all be utilized in embodiments of the invention individually or collectively in arbitrary combination.

BRIEF DESCRIPTION OF THE DRAWING

FIG. 2 shows a schematic sectional view of the NMR tomography magnet system in accordance with the invention with helium tank and superconducting magnet coil;

FIG. 3 shows the system according to FIG. 2 with an additional radiation shield;

DESCRIPTION OF THE PREFERRED EMBODIMENT

Figure 1:
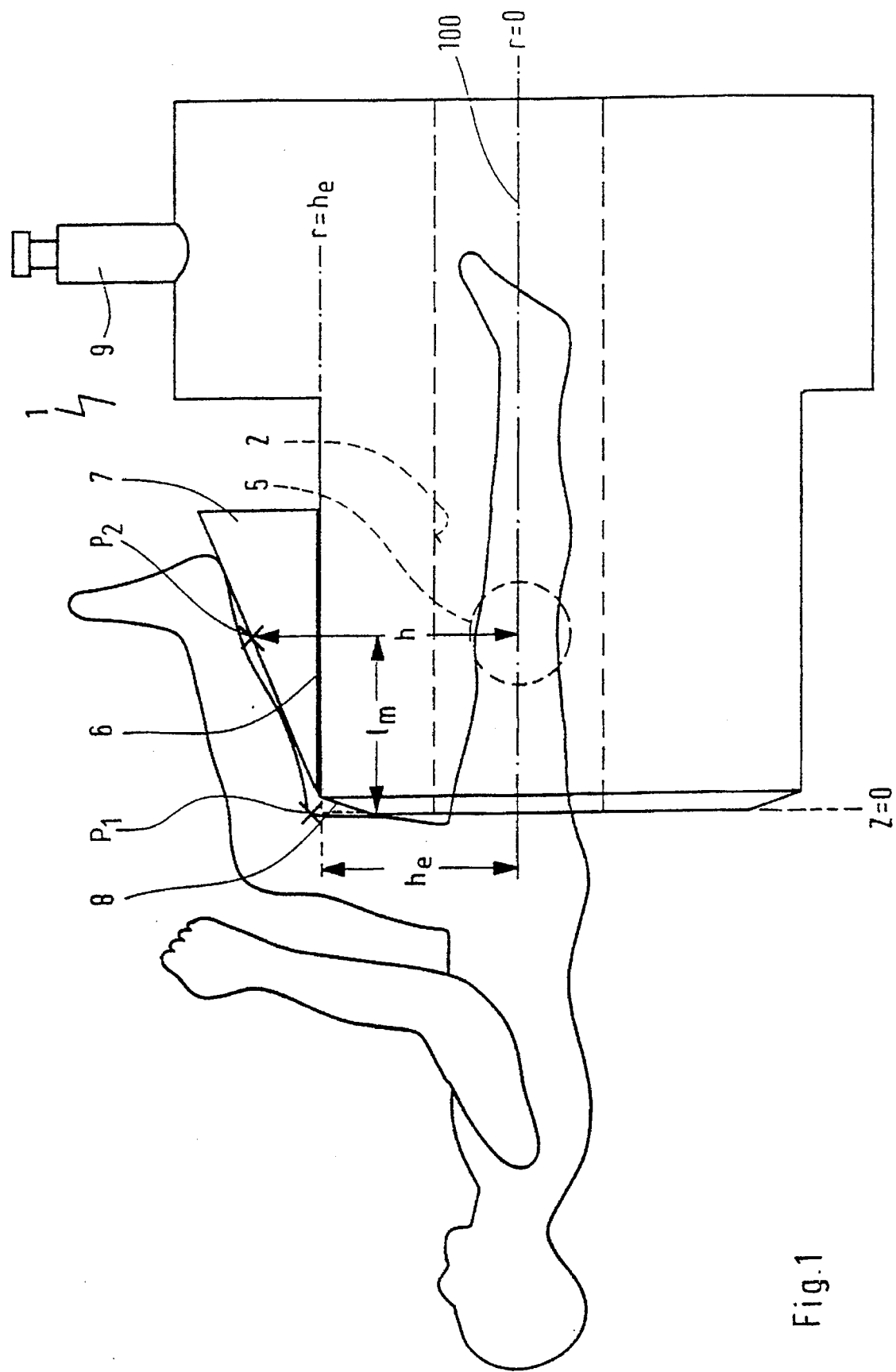
FIG. 1 shows a schematic overview sectional drawing of a partial body tomograph in accordance with the invention with indicated patient.

The schematic overview drawing of FIG. 1 shows an NMR tomography system 1 in accordance with the invention with an indicated patient who has introduced a leg to be examined into the room temperature bore 2 of an approximately 1 m long cryostat of the tomography configuration 1. The other leg of the patient rests comfortably in an angled position on the support 7 on the upper outer skin 6 of the cryostat. The configuration can also utilize a sling (not shown) in which the leg to be investigated can be held. By means of the slanted front end 8 of the cryostat on the patient side the angle, in the measuring position, between the axes of both thighs of the patient can be reduced even more.

The comfortable introduction of the leg of the patient to be investigated is facilitated in that the outer skin 6 of the cryostat at the depth $l_m$ from the patient sided axial end (z=0) of the room temperature bore 2 exhibits, at least in an angular region about the horizontal cryostat axis 100 (r=0), a minimum separation h from the inside of the room temperature bore 2, whereby the approximate center of the homogeneity volume 5 of the homogeneous magnetic field B produced by the main field magnet 4 of the NMR system 1 is located at this separation $l_m$. The room temperature bore 2 has a diameter d between 20 cm and 50 cm, preferentially between 20 cm and 40 cm and $l_m$, $h_e$<35 cm, preferentially<30 cm and h<50 cm.

The NMR tomography magnet system 1 in accordance with the invention is shown more closely in FIG. 2 in a sectional view: it includes a superconducting solenoid coil 4 which is located in a vessel 3 filled with liquid helium having an outer tank tube 3" and inner tank tube 3' and is in intimate thermal contact with the liquid helium in the vessel. The superconducting solenoid coil 4 has a horizontal axis 100 and produces a static magnetic field with a homogeneity of ΔB/B<20 ppm within an approximately spherical-shaped homogeneity volume 5 region with a diameter of approximately 18 cm.

The cryostat has at least one supply tower 9 with a neck tube 12 which terminates in the helium tank 3 for filling or for the evaporation of the liquid helium and for introducing a current-jumper to charge the superconducting solenoid coil 4 which, however, is not shown in the drawing.

In the embodiment of FIG. 1 through FIG. 3, in order to achieve as advantageous a geometry as possible for the investigation of extremities using as simple a construction of the tomography magnet system 1 as possible, the angular region about the horizontal cryostat axis having minimum separation h of the outer skin 6 from the inside of the room temperature bore 2 is arranged vertically above the room temperature bore 2. It could, however, also be arranged sidewards next to the room temperature bore 2. In this case, the patient would have to spread the leg which is not being investigated towards the appropriate side of minimum separation h.

The asymmetric configuration shown in FIGS. 1 through 3 of the liquid helium filled vessel 3 relative to the axis 100 of the superconducting solenoid coil 4 as well as relative to the plane perpendicular to the axis 100 of the superconducting solenoid coil 4 at separation $l_m$ from the patient sided axial end of the room temperature bore 2 causes a displacement of homogeneity volume 5 in the direction towards the patient sided end of the configuration. In this fashion, the homogeneity volume 5 is even more accessible and can, for example, be easily used for the NMR investigation of a patient's knee, as indicated in FIG. 1. In addition, the cryostat shown in FIG. 1 has a substantially smaller outer diameter at the patient side than at the opposite axial end of the configuration, as a result of which the spatial utilization is improved to effect easier accessibility to the measuring volume 5. In the limiting case the hollow volume which is required for the liquid helium can be completely arranged on the opposite side of the patient or diametrically opposed to the leg which is not being investigated so that the separation h can be reduced up to the region of the theoretical minimum.

It is particularly advantageous when the superconducting solenoid coil 4 is largely surrounded by a good heat conducting material which, for its part, exhibits a good heat conducting connection 10 to the bottom of the liquid helium filled vessel 3, by way of example, a copper braid. In this fashion a sufficient cooling of the superconducting solenoid coil 4, even with a low amount of liquid helium in the vessel 3, is guaranteed.

Furthermore, the configuration suggested in FIG. 3 serves to properly cool radiation shields 11 having a side plate 11', an outer jacket 11" and an inner tube 11'" arranged around the room temperature bore 2. It is also possible for a plurality of radiation shields to be provided for, however, at least one radiation shield, exhibiting a temperature between 4,2K and room temperature, should completely surround the solenoid coil 4. In general, this radiation shield 11 will be held at the temperature of liquid nitrogen. It can be cooled via an $N_2$-tank, not shown in the drawing, or by means of a refrigerator which can be arranged at non-disrupting spatial separation from the tomography magnet system 1.

An additional radiation shield is preferentially provided for at a temperature between 4° K. and 70° K. which, for example, can be cooled by the cold helium gas evaporating from the liquid helium and/or likewise by means of a refrigerator.

Figure 4:
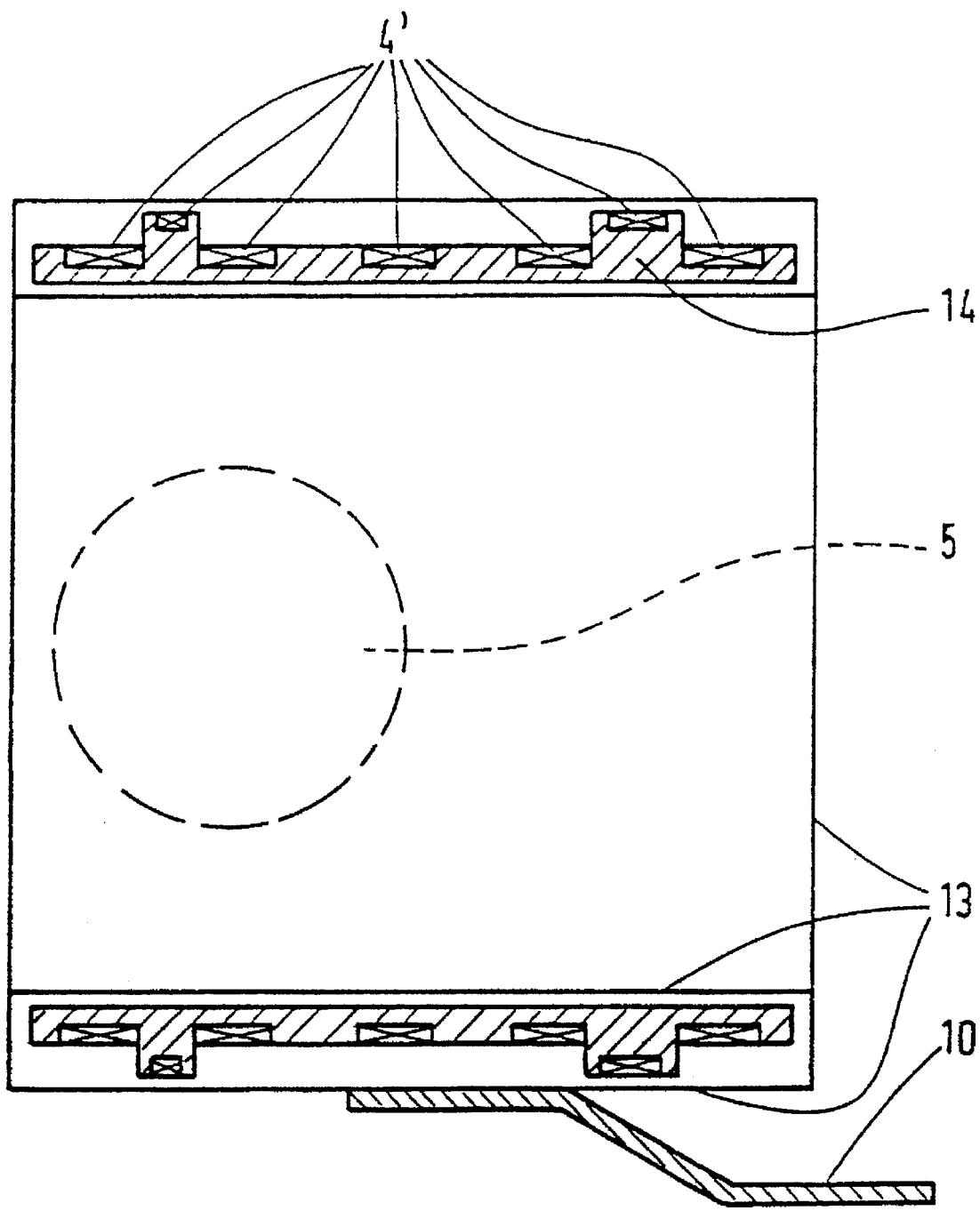
FIG. 4 shows an asymmetric superconducting coil configuration with a good heat conducting jacket.

FIG. 4 shows an asymmetric solenoid coil 4' which exhibits a good heat conducting jacket 13 made, for example, from copper or aluminium sheet metal. Due to the asymmetric distribution, in the axial direction of the windings, of the superconducting coil 4' on the coil support 14, the homogeneity volume 5 of the magnetic field produced by the solenoid coil 4' can be further displaced in the direction towards the patient sided end of the room temperature bore 2 to improve its accessibility. The ease of use of the NMR tomography system 1 in accordance with the invention is thereby further improved.

Figure 5:
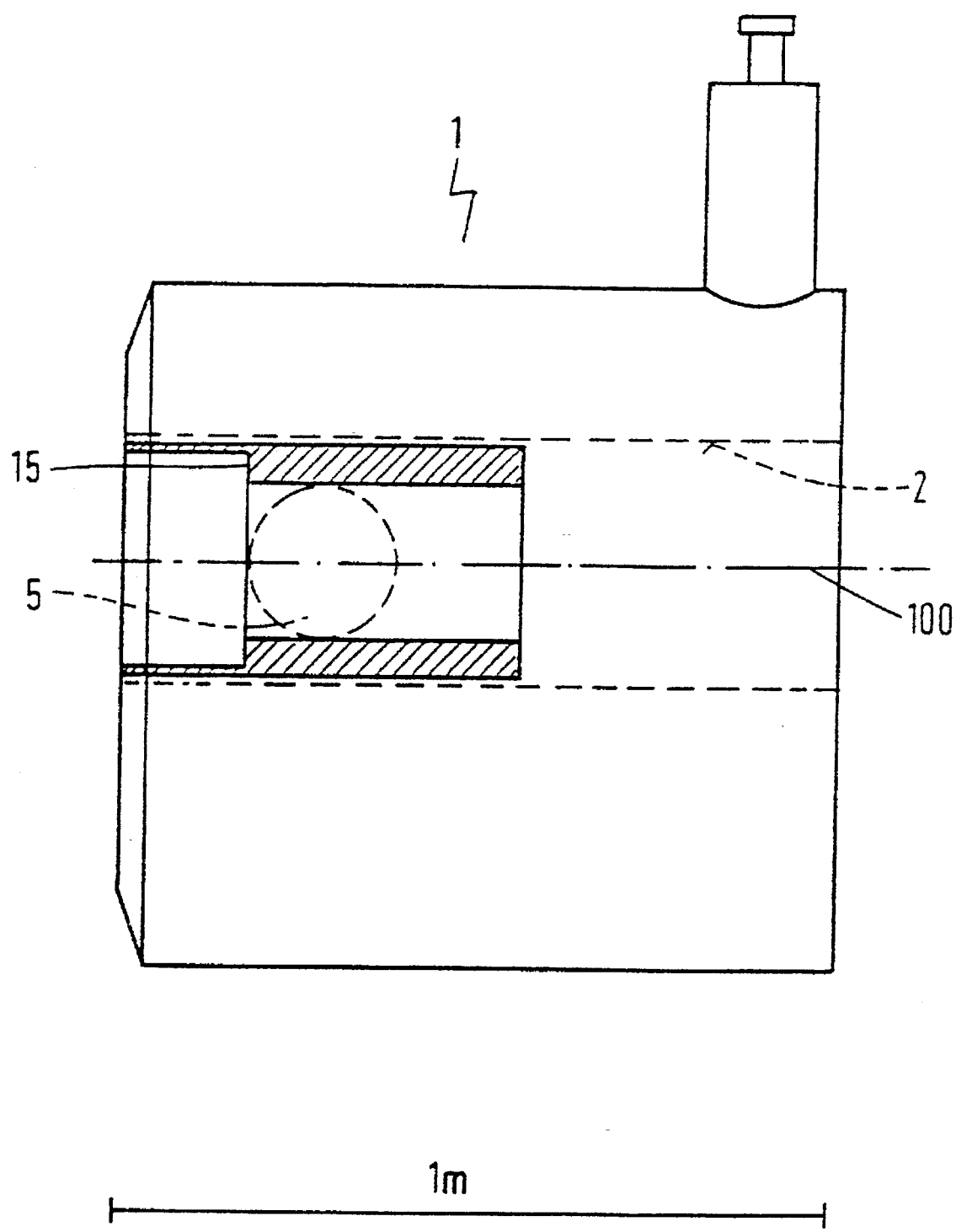
FIG. 5 shows a schematic sectional view of an inventive magnet system with asymmetric gradient coils and "funnel-shaped" entrance opening.
Figure 6:
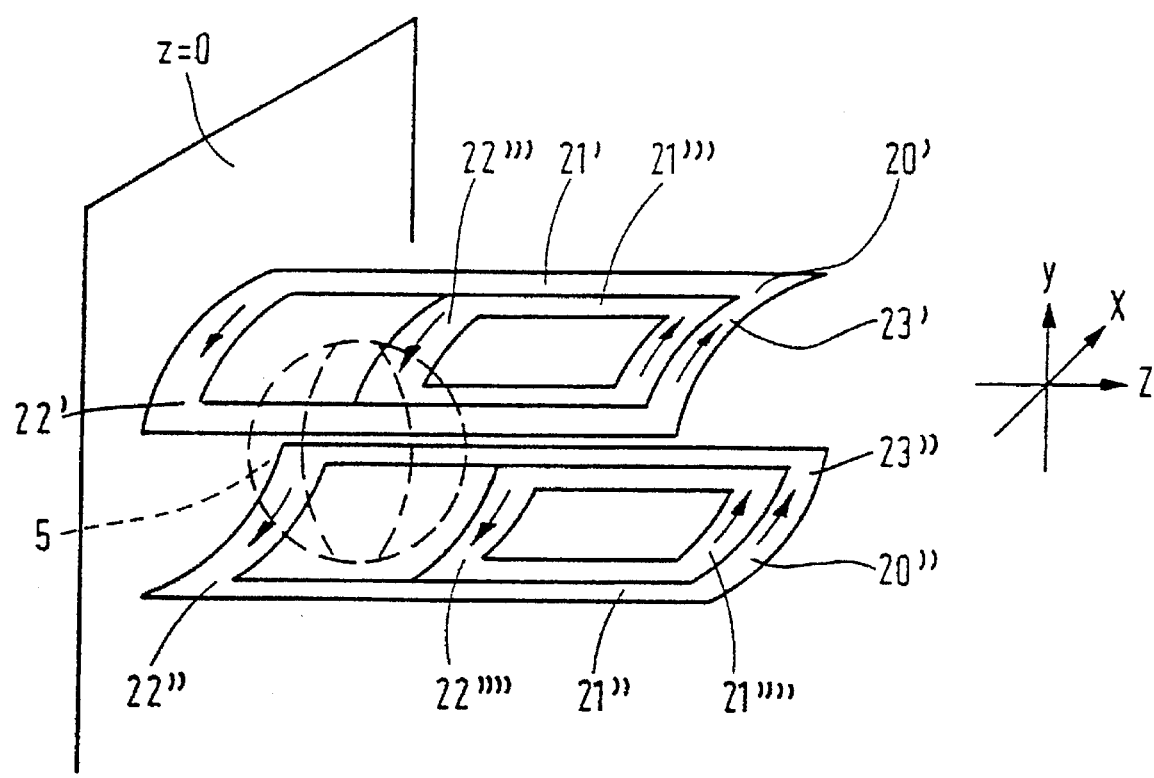
FIG. 6 shows an overall view of a partial coil system with asymmetric gradient coils in accordance with DE 41 2 263 A1.

In particular with the utilization of an asymmetric solenoid coil 4' of this type, the utilization of a likewise asymmetric gradient coil system 15 for the production of at least an approximately constant magnetic field gradient within the homogeneity volume 5 of the static magnetic field B produced from the superconducting solenoid coil 4' is to be recommended. Such a configuration is suggested in FIG. 5. These types of asymmetric "head gradient coils" are per se known in the art from DE 41 42 263 A1. An asymmetric subsystem for the production of a transverse gradient is shown in FIG. 6. The homogeneity volume 5 of the solenoid axis coincides with a measuring volume in which the asymmetric transverse gradient coil currents flowing in the direction of the arrow produce a magnetic field gradient which is approximately linear in the y-direction. By turning the transverse gradient coils by 90° about the z-axis, a configuration is generated which produces an x-gradient.

In the asymmetric configuration of transverse gradient coils shown in FIG. 6, the return current saddle portions 23', 23" of the corresponding useful saddle portions 22', 22" of the partial coils 21', 21" are folded to the viewer's right side of the measuring volume 5. The additional partial coils 21'", 21"", that are likewise arranged on the right side of the plane z =0, remain unchanged with respect to a conventional symmetric configuration. For reasons of geometry, the modified partial coils 21', 21" surround the unchanged partial coils 21'", 21"". The partial coils 21', 21'" therefore form, together with a partial coil 20'and the partial coils 21", 21"", a partial coil 20". As a result of this, the entire configuration of the asymmetric transverse gradient coils is constructed from only two partial coils 20', 20" which lie symmetrically across from another relative to the y =0 plane. The fact that the useful saddle portions 21', 21" produce a somewhat different field distribution than the somewhat smaller useful saddle portions 22'", 22"" can be taken into consideration by having different winding numbers for the corresponding partial coils and by adjusting the precise axial position of the saddle portions 21', 21". In this fashion it is possible to produce a nearly linear field gradient dependence in the measuring volume 5. FIG. 6 clearly shows that the axial access to the measuring volume 5 in the z-direction at the viewer's left side of the z =0 plane can be significantly improved by "folding-away" the return current saddle portions 23', 23".

Figure 7:
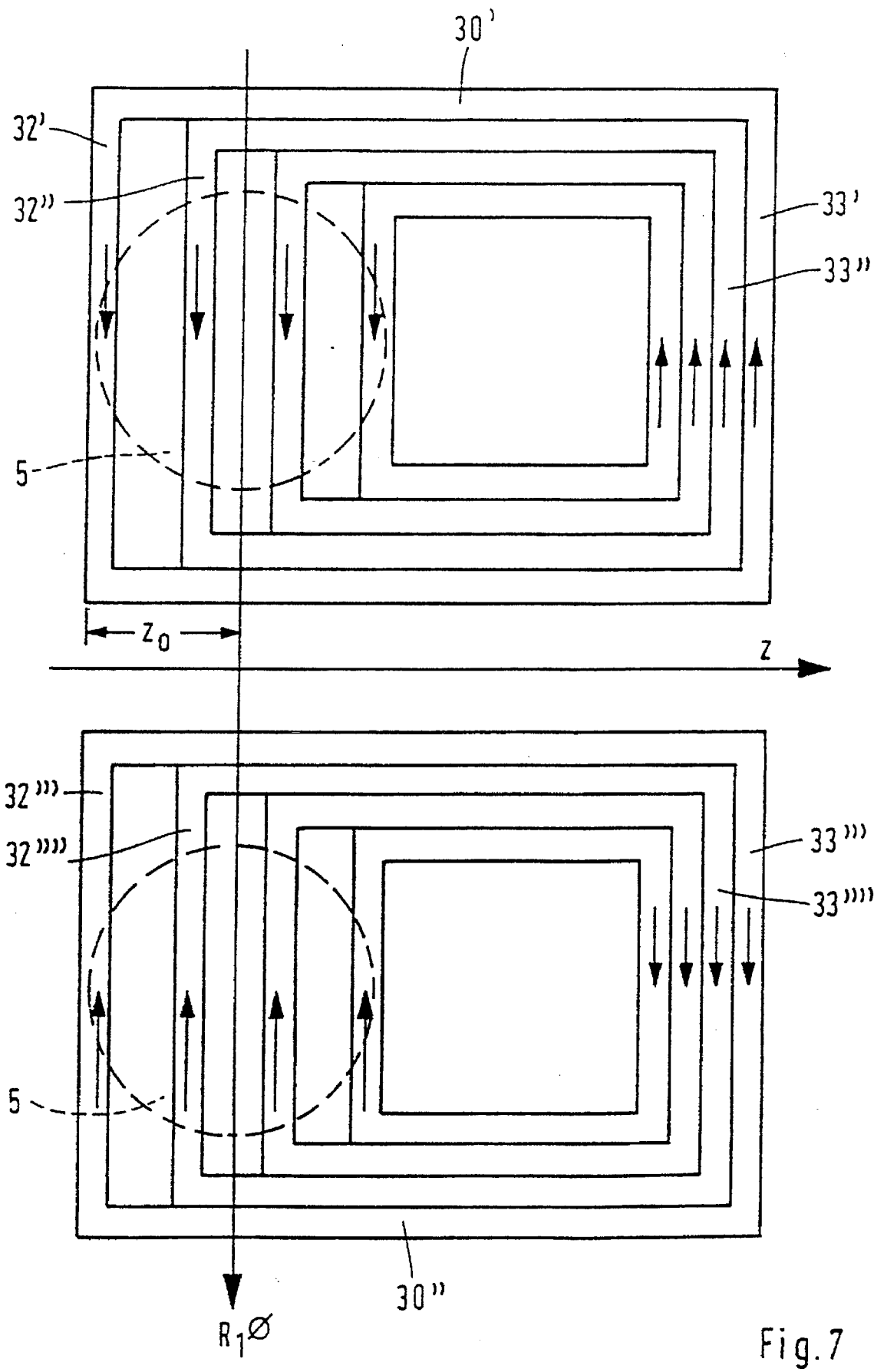
FIG. 7 shows a flattend view of the partial coil system of FIG. 6.

The asymmetric subsystem of transverse gradient coils shown as a flat layout in FIG. 7 consists, on the other hand, of only two oppositely lying partial coils 30', 30" of which the return current saddle portions 33', 33", 33'", 33"" of the useful saddle portions 32', 32", 32'", 32"" are folded onto the side of the z =0 plane opposite to the useful saddle portions. In this fashion a significantly simpler axial access to the measuring volume 5 in the z-direction thereby results at the viewer's left side of the asymmetric double saddle coils shown in FIG. 7, since the separation $z_0$ between the patient sided end of the gradient coil system and the center of the linear investigational region is made significantly smaller compared to the conventional system.

Figure 8:
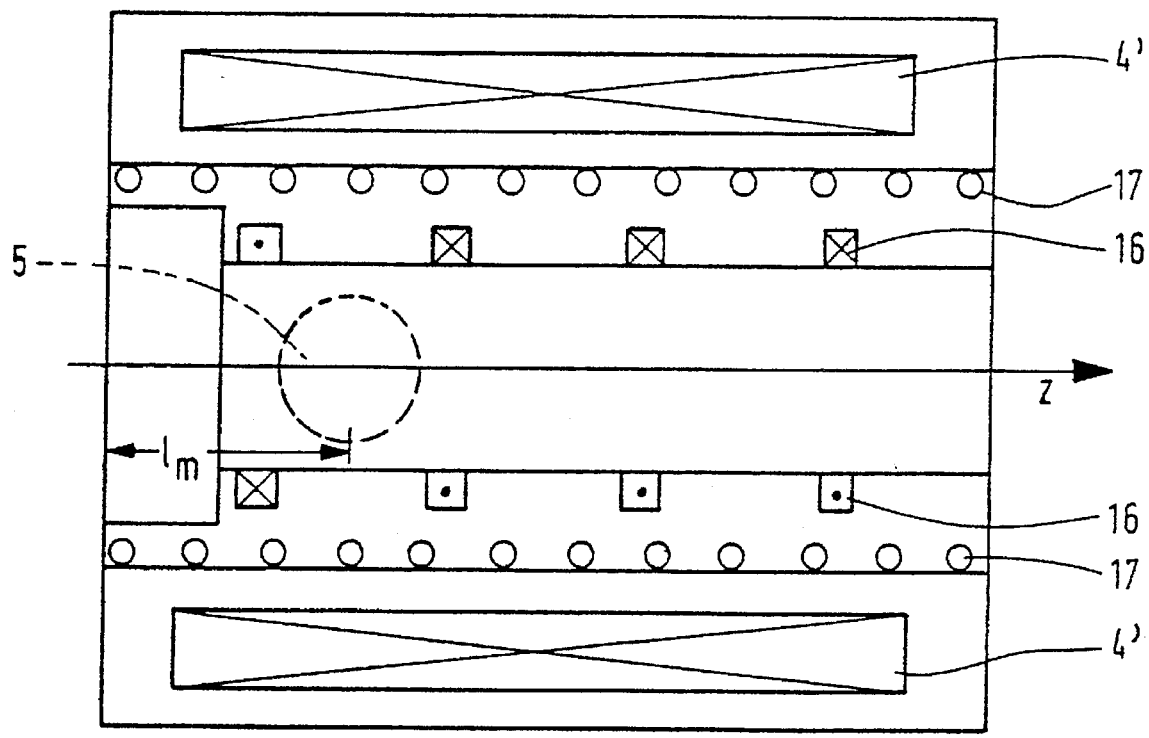
FIG. 8 shows a side sectional view of the partial coil system of FIGS. 6 and 7 relative to other components of the tomography system in accordance with the invention.

The same effect is shown in FIG. 8 in a transverse section through a schematically shown asymmetrical axial gradient coil system 16. Also shown in FIG. 8 is the field coil 4' and an active shielding coil 17. With this configuration, the separation $l_m$ between the front end of the room temperature bore 2, in which an approximately constant linear field gradient can be produced in the z-direction is substantially reduced.

Figure 9:
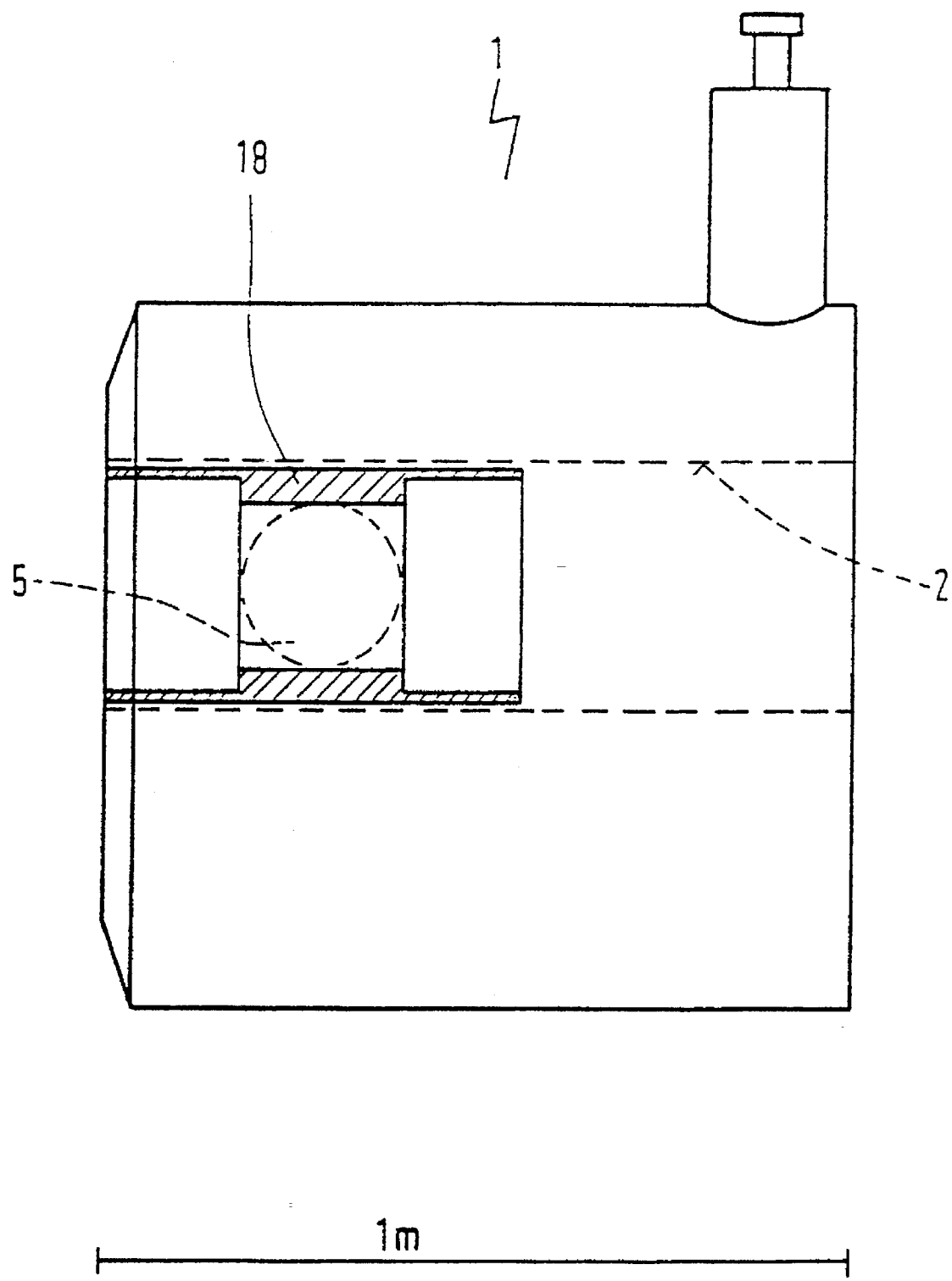
FIG. 9 shows a schematic sectional view of a magnet system in accordance with the invention with tesseral gradient coils and "funnel-shaped" entrance opening.

FIG. 9 schematically shows an additional transverse gradient system 18 which likewise facilitates a funnel-shaped entrance opening at a front end of the room temperature bore 2. The transverse gradient coils 18 are tesseral gradient coils as described in the German patent application P 42 30 145.9-33. They facilitate a still better spatial utilization and allow for an improved accessibility to the investigational volume 5.

Figure 10:
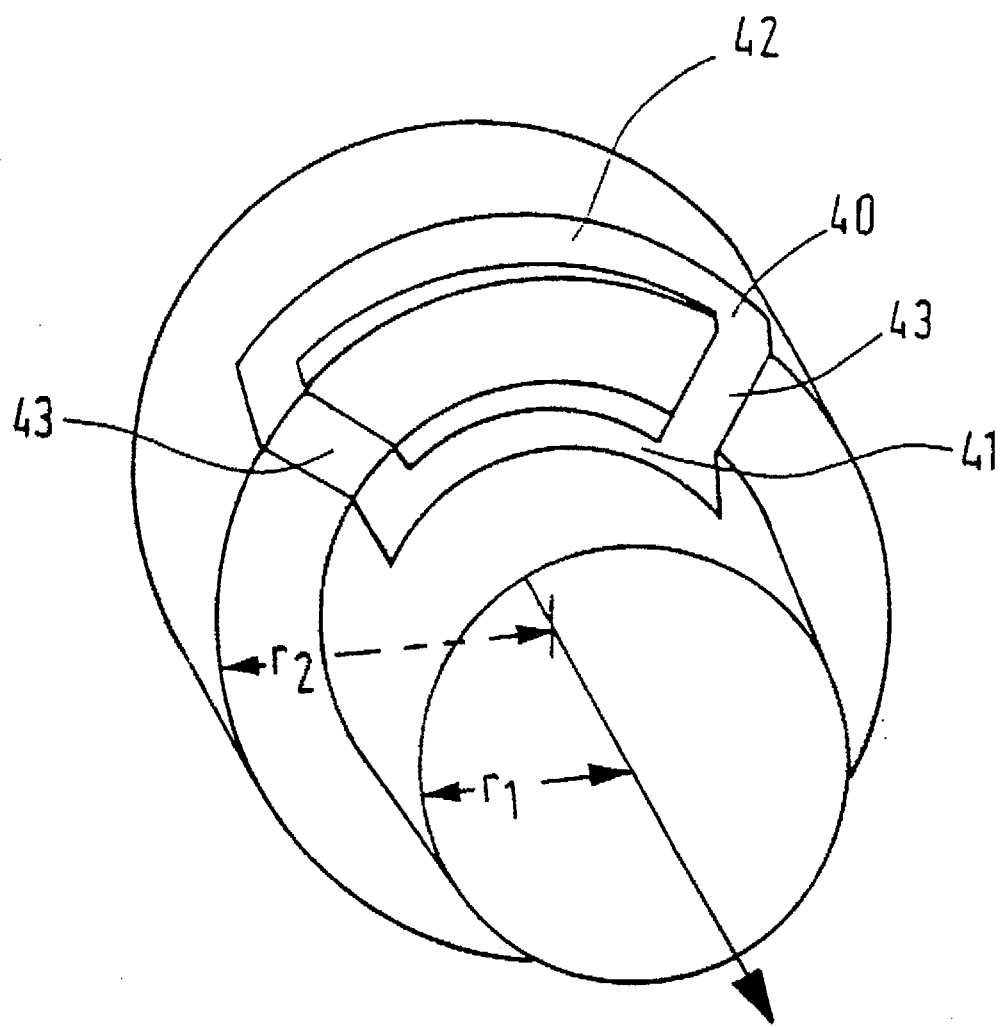
FIG. 10 shows a spatial view of a partial coil of the system of FIG. 9 in accordance with older German patent application P 42 30 145.9-33.

The partial coils 40 of the tesseral gradient system 18 are configured to be saddle-like as can be seen in FIG. 10. The individual partial coils 40 each exhibit two electrically conducting segments 41, 42 which run azimuthally about the z-axis, the radially inner segment 41 of which exhibits a separation $r_1$ and the radially outer segment 42 a separation $r_2$ from the z-axis. Both segments 41, 42 are separated axially with respect to the z-axis, whereby the radially outer segment 42 is closer to the coordinate origin than the radially inner segment 41. Both segments 41, 42 are connected to each other by conductor sections 43.

The partial coils 20 can be constructed from wires, preferentially copper wires, or as shown in FIG. 10, from electrically conducting bands. A further possibility is that the partial coils 40 be constructed as stream-line coils.

In the embodiment shown in FIG. 10 the segments 41, 42 of the partial coils 40 lie on a cylindrical surface about the z-axis. In embodiments not shown, the segments can, however, also lie on conical surfaces which open in the direction towards the coordinate origin.

Compensation coils, which are not shown in the drawing and which are largely similar in their construction to the partial coils 40, can be provided for in order to compensate for the torques caused by current flow through the partial coils 40. In particular, the compensation coils can also exhibit azimuthally inner segments and azimuthally outer segments which exhibit a larger radial separation from the z-axis than the inner segments.

Figure 11:
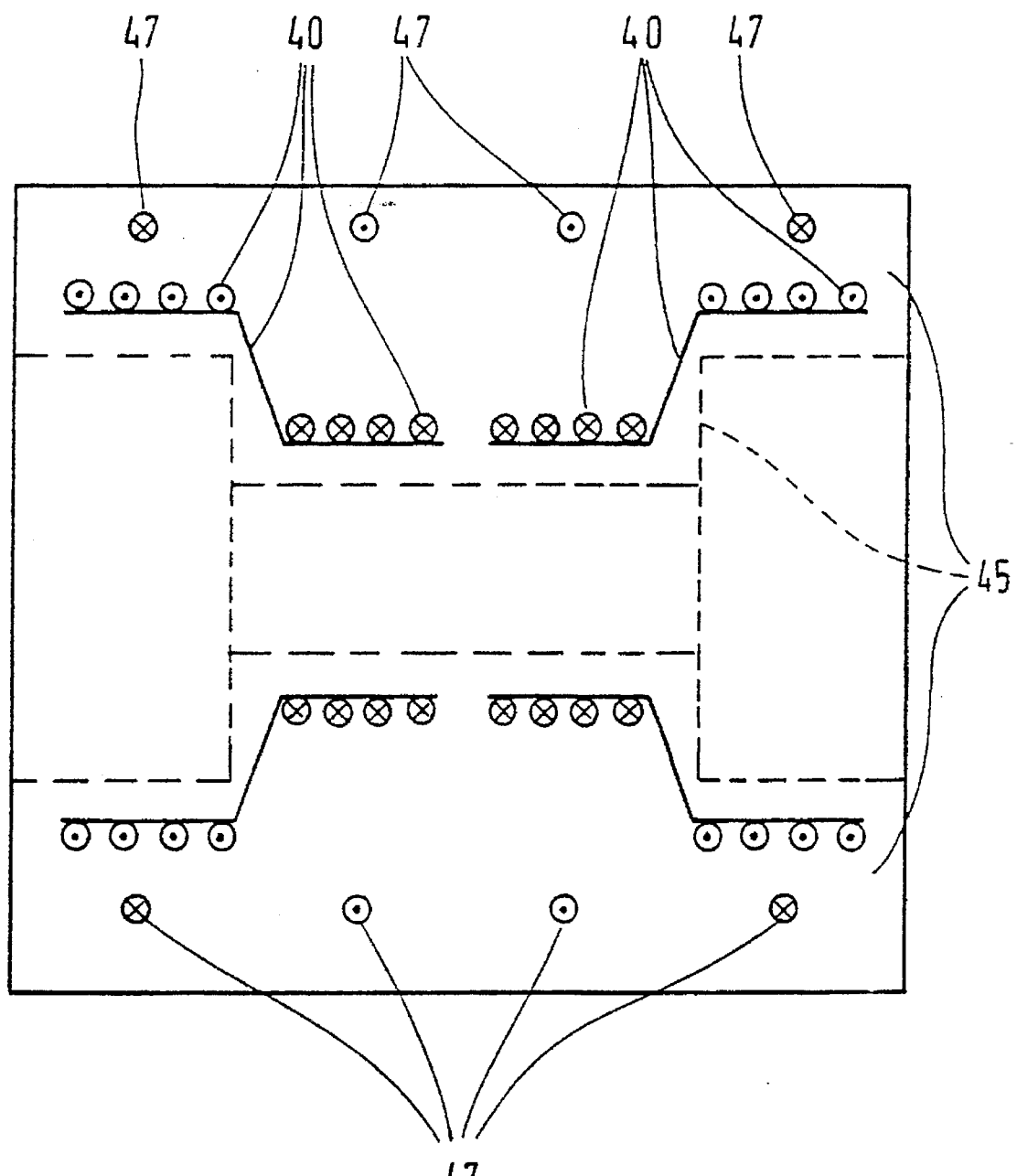
FIG. 11 shows a schematic sectional representation of all four partial coils of a transverse gradient coil on a support body with tesseral gradient coils as in FIG. 10.

Finally, FIG. 11 shows a section of the tesseral gradient coil system in the axial bore of the main field magnet in the xz-plane. The system shown includes four partial coils 40, which are arranged symmetrically about the coordinate origin and are moulded into a plastic support body 45 having an axial bore. Together, the four partial coils 40 in FIG. 11 produce, about the coordinate origin in the investigational volume, a largely constant gradient of the axial magnetic field component in the direction of the x-axis. Not shown in the drawing is a y-gradient system which is rotated by 90° about the z-axis relative to the illustrated x-gradient system and which otherwise exhibits the same construction as the x-gradient system which is shown.

The asymmetric gradient coils system shown in FIGS. 5 through 8 as well as in FIGS. 9 through 11 can be actively shielded by a system of shielding coils 47, which are indicated in FIG. 11, whereby the shielding coils 47 advantageously exhibit the same symmetry as the gradient coils to be shielded. The shielding coils 47 serve to suppress the residual radial components of the magnetic field produced by the gradient coils.

The NMR tomography magnet system 1 in accordance with the invention is configured with all the conventional components which are also used in nuclear spin resonance apparatus applications known in the art, for example, RF transmitter and receiver coil systems, a computer for controlling the measuring and for taking and processing the data, a room temperature shim system, and, if appropriate, a superconducting shim system for the magnet coil, etc.

We claim:

1. A nuclear magnetic resonance (NMR) tomography system, the system having a system geometry described by an orthogonal cylindrical coordinate system having a horizontal z-axis, an r-axis perpendicular thereto, and an azimuthal angle $\phi$ about the z-axis with a coordinate origin at z=r=0, the tomography system comprising:

a cryostat having a first axial end at z=0 and a horizontal room temperature bore having a bore radius between 10 cm and 25 cm, the cryostat also having an outer casing;

a vessel filled with liquid helium located within the cryostat and shaped asymmetrically about the z-axis; and a superconducting solenoid coil shaped symmetrically about the z-axis and in thermal contact with the liquid helium, the solenoid coil generating a static homogeneous magnetic field having a homogeneity volume located within the room temperature bore, the homogeneity volume having a center location at $z=l_m$ and r=0, the outer casing having, within first azimuthal angular region $\Delta\phi_1$ and between z=0 and $z=l_m$, a first outer casing distance $r_1(z)$ from the horizontal axis which is greater than the bore radius and less than $(h-h_e)z/l_m+h_e$, where $h_e$ is a maximum first outer casing distance at z=0 and h is the maximum first outer casing distance at $z=l_m$ with h<50 cm, $h_e$<35 cm, and $l_m$<35 cm, the outer casing having, within a second azimuthal angular region $\Delta\phi_2$, a second outer casing distance $r_2(z)$ from the z-axis which, for $0<z<l_m$, is greater than the first outer casing distance $r_1(z)$.

2. The NMR tomography system of claim 1, wherein $\Delta\phi$ is vertically above the room temperature bore.

3. The NMR tomography system of claim 1, further comprising a support for a patient's leg which is not being investigated, the support being located adjacent to the outer skin of the cryostat within the angular region.

4. The NMR tomography system of claim 1, wherein a first axial end is slanted within the angular region.

5. The NMR tomography system of claim 1, wherein the superconducting solenoid coil comprises an axially asymmetric winding distribution adapted to generate the homogeneity volume and wherein the solenoid coil has an axial length $l_a > 2 l_m$.

6. The NMR tomography system of claim 1, wherein the vessel is arranged asymmetrically relative to a plane perpendicular to the horizontal axis at $z=l_m$.

7. The NMR tomography system of claim 1, wherein the cryostat has a second axial end and the first axial end has a first outer diameter which is smaller than a second outer diameter of the second axial end.

8. The NMR tomography system of claim 1 further comprising a heat conducting means having a heat conducting connection to a deepest region of the vessel.

9. The NMR tomography system of claim 6, further comprising a heat conducting means having a heat conducting connection to a deepest region of the vessel.

10. The NMR tomography system of claim 7, further comprising a heat conducting means having a heat conducting connection to a deepest region of the vessel.

11. The NMR tomography system of claim 1, further comprising at least one of a transverse gradient coil system and an axial gradient coil system for producing at least one magnetic field gradient within the homogeneity volume, the transverse gradient system being constructed unsymmetrically with respect to a plane E dividing the homogeneity volume perpendicular to the horizontal axis, but mirror symmetrically with respect to a plane containing the horizontal axis which likewise divides the homogeneity volume, the transverse gradient system comprising two partial coils with windings having a same winding direction relative to the horizontal axis as given by a direction of the gradient, the axial gradient system being cylindrically symmetric with respect to the horizontal axis and unsymmetric relative to the plane E, the axial gradient coil comprising a first partial coil arranged at a first side of the plane E and a second partial coil arranged at a second side of the plane E, the first partial coil having a first winding direction opposite to a second winding direction of the second partial coil and a first number of windings not equal to a second number of windings of the second partial coil.

12. The NMR tomography system of claim 1, further comprising a tesseral gradient coil system for producing a magnetic field gradient within the homogeneity volume, the tesseral gradient system comprising four essentially equal symmetric saddle-type partial coils arranged at radial and axial separations from a center of the homogeneity volume, each saddle-type partial coil comprising a first and a second conducting segment, both segments extending in an azimuthal direction about the horizontal axis, the first conducting segment having as small a radial separation $r_1$ and the second conducting segment as large a radial separation $r_2$ from the horizontal axis as possible, each partial coil also comprising a plurality of windings, and both conducting segments being arranged at an axial separation from each other in the z-direction, the second conducting segment being axially, along the z-direction, closer to the coordinate origin than the first conducting segment, both conducting segments being connected to each other by conducting sections and being located on a common surface which is one of rotationally symmetric and ellipsoidal.

13. The NMR tomography system of claim 11, further comprising a system of active shielding coils having a symmetry which is the same as a symmetry of one of the transverse gradient coil system and the axial gradient coil system.

14. The NMR tomography system of claim 1, wherein $\Delta\phi$ is sideward beside the room temperature bore.

15. A nuclear magnetic resonance (NMR) tomography system, the system having a system geometry described by an orthogonal cylindrical coordinate system having a horizontal z-axis, an r-axis perpendicular thereto, and an azimuthal angle $\phi$ about the z-axis with a coordinate origin at $z=r=0$, the tomography system comprising:

a cryostat having a first axial end at $z=0$, a second axial end, and a horizontal room temperature bore shaped symmetrically about the z-axis and having a bore radius between 10 cm and 25 cm, the cryostat also having an outer casing;

a vessel filled with liquid helium located within the cryostat and shaped asymmetrically relative to a plane perpendicular to the z-axis, said plane being located at $z=l_m$; and a superconducting solenoid coil shaped symmetrically about the z-axis in thermal contact with the liquid helium, the solenoid coil generating a static homogeneous magnetic field having a homogeneity volume located within the room temperature bore, the homogeneity volume having a center location at $z=l_m$ and $r=0$, the outer casing having, within a first azimuthal angular region $\Delta\phi_1$ and between $z=0$ and $z=l_m$, a first outer casing distance $r_1(z)$ from the z-axis which is greater than the bore radius and less than $(h-h_e) z/l_m+h_e$ where $h_e$ is a maximum first outer casing distance at $z=0$ and h is the maximum first outer casing distance at $z=l_m$ with h<50 cm, $h_e$<35 cm, and $l_m$<35 cm, the first axial end having a first outer diameter and the second axial end having a second outer diameter which is greater than the first outer diameter.

16. A nuclear magnetic resonance (NMR) tomography system, the system having a system geometry described by an orthogonal cylindrical coordinate system having a horizontal z-axis, an r-axis perpendicular thereto, and an azimuthal angle $\phi$ about the z-axis with a coordinate origin at $z=r=0$, the tomography system comprising:

a cryostat having a first axial end at $z=0$, a second axial end, and a horizontal room temperature bore shaped symmetrically about the z-axis and having a bore radius between 10 cm and 25 cm, the cryostat also having an outer casing;

a vessel filled with liquid helium located within the cryostat shaped asymmetrically about the z-axis and shaped asymmetrically relative to a plane perpendicular to the z-axis, said plane being located at $z=l_m$; and a superconducting solenoid coil shaped symmetrically about the z-axis in thermal contact with the liquid helium, the solenoid coil generating a static homogeneous magnetic field having a homogeneity volume located within the room temperature bore, the homogeneity volume having a center location at $z=l_m$ and $r=0$, the outer casing having, within a first azimuthal angular region $\Delta\phi_1$, which is vertically above the room temperature bore and between $z=0$ and $z=l_m$, a first outer casing distance $r_1(z)$ from the z-axis which is greater than the bore radius and less than $(h-h_e) z/l_m+h_e$ where $h_e$ is a maximum first outer casing distance at $z=0$ and h the maximum first outer casing distance at $z=l_m$ with h<50 cm, $h_e$<35 cm, and $l_m$<35 cm, the first axial end having a first outer diameter, the second axial end having a second outer diameter which is greater than the first outer diameter, the outer casing having a second outer casing distance $r_2(z)$ from the z-axis within a second azimuthal angle region $\Delta\phi_2$ which, for $0<z<l_m$, is greater than the first outer casing distance.

* * * * *